(12) United States Patent
Fang

(10) Patent No.: US 7,262,497 B2
(45) Date of Patent: Aug. 28, 2007

(54) BUMPLESS ASSEMBLY PACKAGE

(75) Inventor: Jen-Kuang Fang, Pingtung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 737 days.

(21) Appl. No.: 10/704,719

(22) Filed: Nov. 12, 2003

(65) Prior Publication Data
US 2004/0226743 A1  Nov. 18, 2004

(30) Foreign Application Priority Data
Mar. 25, 2003  (TW) ............................... 92106680 A

(51) Int. Cl.
*H01L 23/12* (2006.01)
*H01L 21/00* (2006.01)
*H05K 1/18* (2006.01)

(52) U.S. Cl. ..................... 257/701; 257/713; 257/758; 257/780; 257/E23.008; 257/23.169; 361/761; 361/767; 361/783; 438/125

(58) Field of Classification Search .................. None
See application file for complete search history.

(56) References Cited

U.S. PATENT DOCUMENTS

| | | | | |
|---|---|---|---|---|
| 5,468,994 A | * | 11/1995 | Pendse | 257/693 |
| 5,945,741 A | * | 8/1999 | Ohsawa et al. | 257/777 |
| 6,110,608 A | * | 8/2000 | Tanimoto et al. | 428/647 |
| 6,452,258 B1 | * | 9/2002 | Abys et al. | 257/677 |
| 6,555,906 B2 | * | 4/2003 | Towle et al. | 257/723 |
| 6,563,212 B2 | * | 5/2003 | Shibamoto et al. | 257/712 |

* cited by examiner

*Primary Examiner*—Alonzo Chambliss
(74) *Attorney, Agent, or Firm*—Bacon & Thomas, PLLC

(57) ABSTRACT

A bumpless assembly package mainly comprises a substrate, and a chip. The substrate has an upper surface and an opposite lower surface, a plurality of first contacts and a plurality of second contacts formed on the upper surface of the substrate, wherein one of the first contacts is electrically connected to one of the second contacts. The chip has an active surface and a boding pad formed on the active surface and is disposed in the opening, Moreover, an electrically conductive layer is disposed above the upper surface of the substrate and the active surface of the chip, and extended from the upper surface of the substrate to the active surface of the chip so as to electrically connect the chip and the substrate. In addition, a protective layer is provided to dispose above the electrically conductive layer and expose the second contacts so that the second contacts can electrically connect to external electronic devices.

26 Claims, 4 Drawing Sheets

BUMPLESS ASSEMBLY PACKAGE

BACKGROUND OF THE INVENTION

1. Field of Invention

This invention relates to a semiconductor assembly package. More particularly, the present invention is related to a bumpless assembly package.

2. Related Art

Integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Originally, the electrical connection between the chips comprises wire bonding connection and flip chip connection. In wire bonding connection, a wire bonder is disposed above the chip and then the tip of the conductive wire is melting to shape into a ball. Next, the conductive wire is bonded onto the bonding pad of the chip. Then, the wire bonder is moved and disposed above another bonding pad of the chip, and then another conductive wire will be bonded onto the corresponding bonding pad of the chip in the same way as mentioned above. In flip chip bonding, a plurality of bumps are formed on the bonding pads of the chip, and then flipped and bonded to another chip by a reflow process.

Next, a well-known wire bonding method utilized in a convention assembly package will be disclosed as below. As shown in FIG. 1, it illustrates the cross-sectional view of the conventional assembly package with wire bonding connection. The assembly package comprises a substrate 10, a chip 12, a plurality of conductive wires 160, an encapsulation 18 and a plurality of solder balls 19, 107. The substrate 10, for example an organic substrate and a lead frame, has an upper surface 102 and an opposite lower surface 104, a die paddle 105, and a plurality of contacts 106. The die paddle 105 and the contacts 106 are formed on the upper surface 102, and the die paddle 105 is encompassed with the contacts 106. As mentioned above, the chip 12 has an active surface 122, a back surface 124 and a plurality of bonding pads 126 formed on the active surface 122. It is should be noted that the first chip 12 is mounted onto the die paddle 105 of the substrate 10 via an adhesive 109 and electrically connected to the substrate 10 via the conductive wire 160. Therein one end of the conductive wire 160 is bonded to the bonding pad 126 and the other end of the conductive wire 160 is bonded onto the contact 106 of the substrate 10. Besides, the encapsulation 18 encapsulates the chip 12, the upper surface 102 of the substrate 10 and the conductive wires 160.

In the above-mentioned assembly package, the chip 12 is electrically connected to the substrate 10 through the conductive wire 160. However, the cross-sectional area of the conductive wire 160 is small and the length of the conductive wire 160 is long so as to cause the characterization impedance to be mismatched and to cause the signal to be attenuated. Besides, when the high-frequency circuits are performed, the parasitics of the inductance and the capacitor will be induced to cause the signal to be reflected. In addition, the cross-sectional area of the conductive wire 160 for connecting the chip 12 is so small that the grounding connection will become worse. Moreover, as shown in FIG. 2, the chip 12 also can be bonded to the substrate 10 through flip chip bonding method and electrically connected to the substrate 10 via the bumps 162.

Therefore, providing another semiconductor assembly package to solve the mentioned-above disadvantages is the most important task in this invention.

SUMMARY OF THE INVENTION

In view of the above-mentioned problems, an objective of this invention is to provide a bumpless assembly package with an electrically conductive layer, which can shorten the distance of the electrical connection between the chip and substrate so as to upgrade the electrical performance of the assembly package.

To achieve the above-mentioned objective, a bumpless assembly package is provided, wherein the bumpless assembly package comprises a substrate and a chip. The substrate has an upper surface, an opposite lower surface, an opening passing through the upper surface and the lower surface, a plurality of first contacts and a plurality of second contacts on the upper surface of the substrate, wherein one of the first contacts is electrically connected to one of the second contacts. The chip has an active surface, a back surface and a plurality of bonding pads formed on the active surface, and the chip is disposed in the opening. In addition, an electrically conductive layer is formed on the upper surface of the substrate and the active surface of the chip, and the electrically conductive layer is extended from the active surface to the upper surface so as to electrically connect one of the bonding pads of the chip and one of the first contacts of substrate. Moreover, a protection layer is formed above the electrically conductive layer to expose the second contacts so that the second contacts can electrically connect to external circuits or electronic devices.

According to this invention, the chips are electrically connected to each other through the electrically conductive layer. Namely, the electrically conductive layer is taken as the electrical connection between the chips, so the distance of the electrical connection between the chips is short. Thus, the characterization impedance can be lowered to prevent the signal from being attenuated. Furthermore, this invention can prevent the parasitics of the inductance and the capacitor from being induced so as to be suitable to the assembly package designed for performing high-circuits. Moreover, it is unnecessary to take bumps as electrically conductive connection between the chip and substrate. Accordingly, the assembly process will be simplified.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The bumpless assembly package according to the preferred embodiment of this invention will be described herein below with reference to the accompanying drawings, wherein the same reference numbers refer to the same elements.

Figure 1:
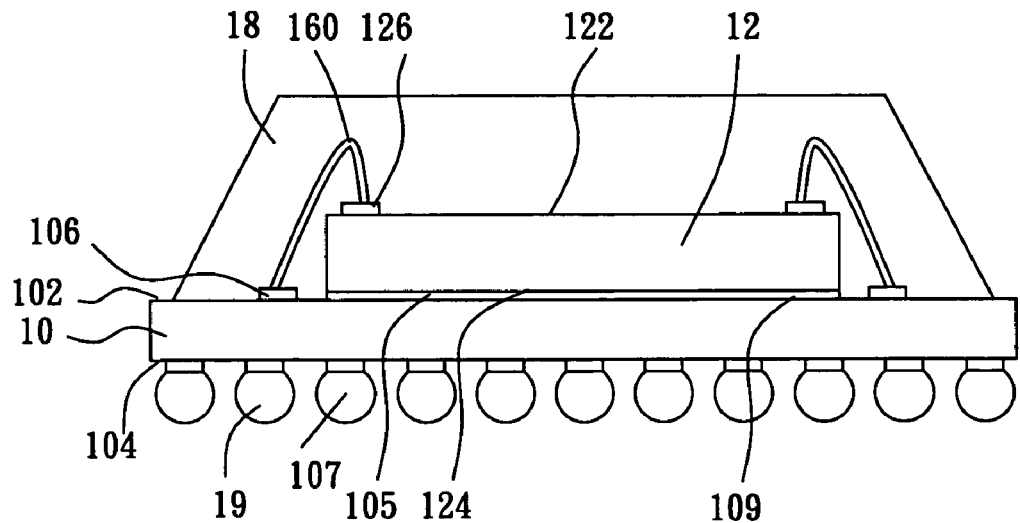
FIG. 1 is a cross-sectional view of the conventional assembly package.
Figure 2:
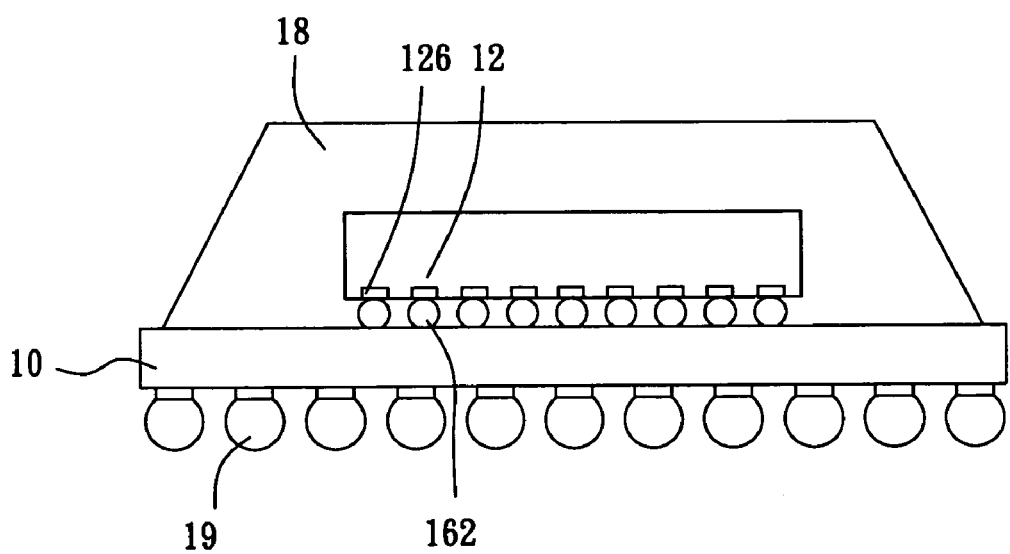
FIG. 2 is a cross-sectional view of another conventional assembly package.
Figure 3:
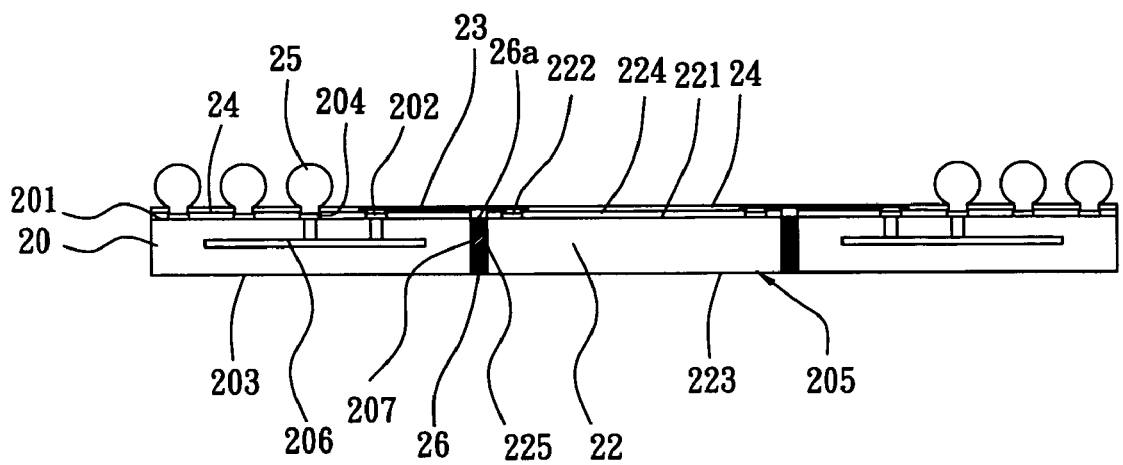
FIG. 3 is a cross-sectional view of a bumpless assembly package according to the first embodiment of the present invention.

In accordance with a first preferred embodiment as shown in FIG. 3, there is provided a bumpless assembly package. The bumpless assembly package mainly comprises a substrate 20 and a chip 22. The substrate 20 has an upper surface 201, an opposite lower surface 203, an opening 205 passing through the upper surface 201 and the lower surface 203 of the substrate 20, and a plurality of first contacts 202 and second contacts 204 which are formed on the upper surface 202 of the substrate 20 and are electrically connected with each other via circuit traces 206. The chip 22 has an active surface 221 and a back surface 223. It also should be noted that the active surface 221 of the chip 22 is coplanar to the upper surface 202 of the substrate 20, and the lower surface 203 of the substrate 20 exposes the back surface 223 of the chip 22. Therein, the chip 22 further has at least one bonding pad 222 formed on the active surface 221, and a passivation layer 224 covering the active surface 221 to expose the bonding pad 222. Moreover, an electrically conductive layer 23 is disposed above the passivation layer 224 and the bonding pad 222, and extended to electrically connect the bonding pad 222 to the first contacts 202 by the method of development and etching. Therein, the electrically conductive layer 23 mainly comprises an adhesive layer, a barrier layer and a wetting layer (not shown). The material of the adhesive layer can be selected from one of titanium, titanium-tungsten, aluminum, and chromium; the material of the barrier layer can be selected from one of nickel and nickel-vanadium alloy; and the wetting layer is selected from one of copper, barium, and gold.

As mentioned above, there is a protective layer 24 formed above the electrically conductive layer 23 and a portion of the upper surface 201 covered by the electrically conductive layer 23 so as to expose the second contacts 204. Therein, the protective layer 24 is made of insulation, for example epoxy and Bismaleimide-Triazine (BTU), and formed above the electrically conductive layer 23 by the method of spin-coating. In addition, a dry film can be attached to the electrically conductive layer 23 and a portion of the upper surface 201 not covered by the electrically conductive layer 23.

Besides, another electrically conductive devices 25, for example solder balls, are attached to the second contacts 204 of the substrate 20. Thus, the chip 22 is electrically connected to the substrate 20, and then electrically connected to external electronic devices, for example motherboard, through the bonding pads 222, the first contacts 202, the electrically conductive layer 23, the circuit traces 206, the second contacts 204 and the solder balls 25.

Moreover, as shown in FIG. 3, when the chip 22 is disposed in the opening 205 and the side wall 225 of the chip 22 is not directly contacted to the inner wall 207 of the opening 205, the gap between the inner wall 207 and the side wall 225 is filled with a filler 26, for example an non-electrically conductive adhesive. Therein, the top surface 26a of the filler 26 is coplanar to the active surface 221 of the chip 22 and the upper surface 201 of the substrate 20.

Figure 4:
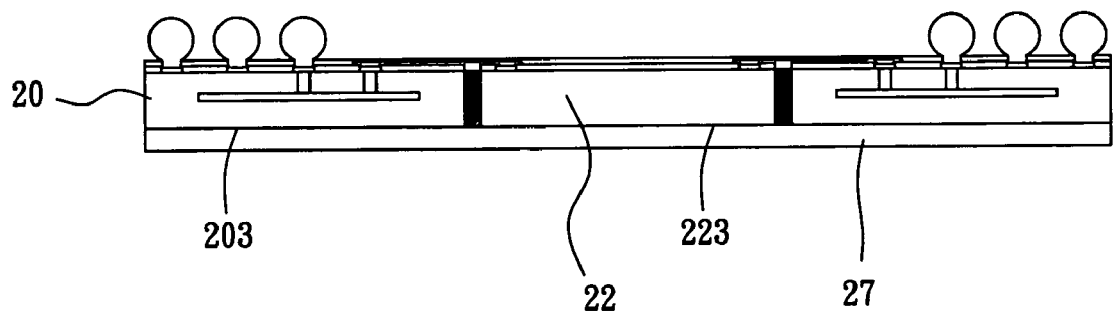
FIG. 4 is a cross-sectional view of a bumpless assembly package according to the second embodiment of the present invention.

Next, referring to FIG. 4, a second preferred embodiment is provided. As shown in FIG. 4, there is further provided a heat spreader 27 attached on the back surface 223 of the chip 22 and the lower surface 203 of the substrate 20 so as to dissipate the heat generated from the chip 22 to the outside through the heat spreader 27 with a larger thermally conductive area.

Figure 5:
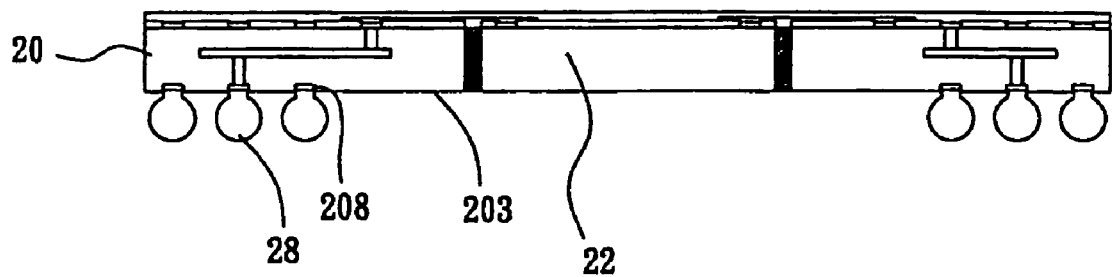
FIG. 5 is a cross-sectional view of a bumpless assembly package according to the third embodiment of the present invention.

Furthermore, referring to FIG. 5, a third preferred embodiment is provided. The most difference between the first embodiment and the third embodiment is that the second contacts 208 are disposed on the lower surface 203 of the substrate 20. Accordingly, the solder balls 28 are mounted on the lower surface 203 of the substrate 20.

Figure 6:
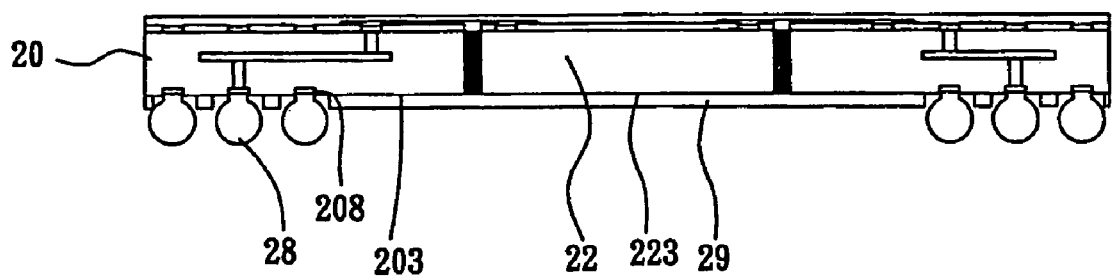
FIG. 6 is a cross-sectional view of a bumpless assembly package according to the fourth embodiment of the present invention.

In addition, referring to FIG. 6, a fourth preferred embodiment is provided. There is further another heat spreader 29 formed on the lower surface 203 and covering the lower surface 203 to expose the second contacts 208 and the solder balls 28 attached to the second contacts 208.

Figure 7:
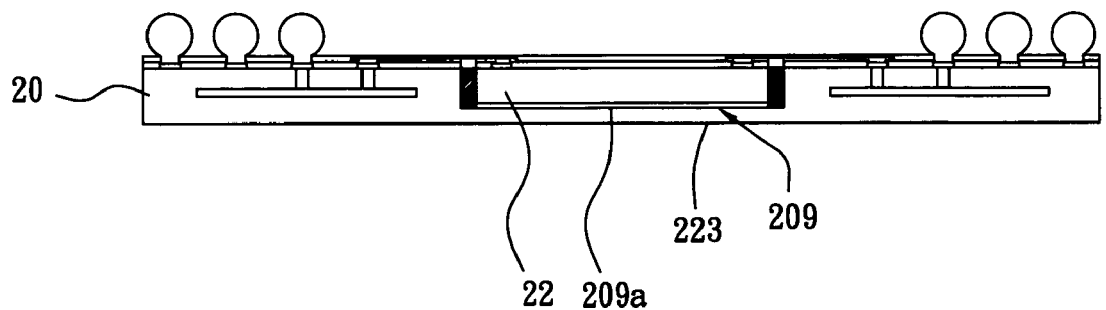
FIG. 7 is a cross-sectional view of a bumpless assembly package according to the fifth embodiment of the present invention.
Figure 8:
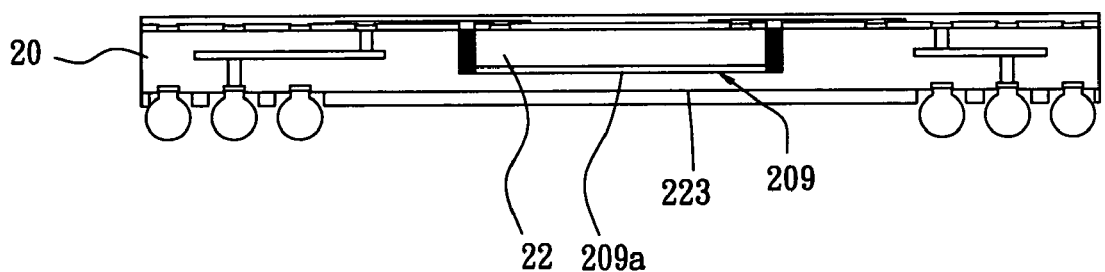
FIG. 8 is a cross-sectional view of a bumpless assembly package according to the sixth embodiment of the present invention.

Finally, pay attention to FIG. 7 and FIG. 8, which specify a fifth and a sixth preferred embodiment respectively. The opening 205 can only pass through the upper surface to be a cavity 209 with a cavity-surface 209a. Accordingly, the chip 22 is disposed on the cavity-surface 209a of the cavity 209. It should be noted that the fifth embodiment and the sixth embodiment shown in FIGS. 7 and 8 are corresponding the third embodiment and the fourth embodiment provided in FIG. 5 and FIG. 6.

Although the invention has been described in considerable detail with reference to certain preferred embodiments, it will be appreciated and understood that various changes and modifications may be made without departing from the spirit and scope of the invention as defined in the appended claims.

What is claimed is:

1. A bumpless assembly package, comprising:
   a substrate having an upper surface, a lower surface opposed to the upper surface, an opening passing through the upper surface, a plurality of first contacts and a plurality of second contacts formed on the upper surface, wherein one of the first contacts electrically connects to one of the second contacts;
   a chip having an active surface, a back surface and a plurality of bonding pads formed on the active surface, wherein the chip is disposed in the opening and the active surface of the chip faces away from the lower surface,
   an electrically conductive layer disposed above the active surface of the chip and the upper surface of the substrate, wherein the electrically conductive layer is extended from the active surface of the chip to the upper surface of the substrate so as to electrically connect the chip and the substrate and covers at least one of the plurality of first contacts; and
   a protective layer formed on the electrically conductive layer to expose the second contacts.

2. The bumpless assembly package of claim 1, further comprising a plurality of electrically conductive devices attached onto the second contacts.

3. The bumpless assembly package of claim 2, wherein the electrically conductive devices are solder balls.

4. The bumpless assembly package of claim 1, wherein the chip further has a side wall and the opening of the substrate further has an inner wall close to the side wall.

5. The bumpless assembly package of claim 1, wherein the active surface of the chip is coplanar to the upper surface of the substrate.

6. The bumpless assembly package of claim 1, wherein the opening further passes through the lower surface of the substrate so that the lower surface of the substrate exposes the back surface of the chip.

7. The bumpless assembly package of claim 6, wherein the chip further has a side wall and the opening of the substrate further has an inner wall, and a filler is disposed between the side wall and the inner wall.

8. The bumpless assembly package of claim 7, wherein the filler has a top surface and a bottom surface, and the top surface are coplanar to the upper surface of the substrate and the active surface of the chip.

9. The bumpless assembly package of claim 7, wherein the filler is a non-electrically conductive material.

10. The bumpless assembly package of claim 6, further comprising a heat spreader attached onto the lower surface of the substrate and the back surface of the chip.

11. The bumpless assembly package of claim 1, wherein the opening define a cavity formed in the substrate and the cavity has a cavity-surface carrying the chip and connecting to the back surface of the chip.

12. The bumpless assembly package of claim 1, wherein the protective layer is made of a material selected from one of insulator, epoxy and bismaleimide-Triazine.

13. The bumpless assembly package of claim 1, wherein the bumpless assembly package further comprises a conductive trace and the first contact electrically connects to the second contact via the conductive trace.

14. A bumpless assembly package, comprising:
a substrate having an upper surface, a lower surface opposed to the upper surface, an opening passing through the upper surface, a plurality of first contacts and a plurality of second contacts formed on the upper surface and the lower surface respectively, wherein one of the first contacts electrically connects to one of the second contacts;
a chip having an active surface, a back surface and a plurality of bonding pads formed on the active surface, wherein the chip is disposed in the opening and the active surface of the chip faces away from the lower surface;
an electrically conductive layer disposed above the active surface of the chip and the upper surface of the substrate, wherein the electrically conductive layer is extended from the active surface of the chip to the upper surface of the substrate so as to electrically connect the chip and the substrate and covers at least one of the plurality of first contacts; and
a protective layer formed on the electrically conductive layer.

15. The bumpless assembly package of claim 14, further comprising a plurality of electrically conductive devices attached onto the second contacts.

16. The bumpless assembly package of claim 15, wherein the electrically conductive devices are solder balls.

17. The bumpless assembly package of claim 14, wherein the chip further has a side wall and the opening of the substrate further has an inner wall close to the side wall.

18. The bumpless assembly package of claim 14, wherein the active surface of the chip is coplanar to the upper surface of the substrate.

19. The bumpless assembly package of claim 14, wherein the opening further passes through the lower surface of the substrate so that the lower surface of the substrate exposes the back surface of the chip.

20. The bumpless assembly package of claim 19, wherein the chip further has a side wall and the opening of the substrate further has an inner wall, and a filler is disposed between the side wall of the chip and the inner wall of the opening.

21. The bumpless assembly package of claim 20, wherein the filler has a top surface, and the top surface are coplanar to the upper surface of the substrate and the active surface of the chip.

22. The bumpless assembly package of claim 20, wherein the filler is a non-electrically conductive material.

23. The bumpless assembly package of claim 19, further comprising a heat spreader attached onto the lower surface of the substrate and the back surface of the chip.

24. The bumpless assembly package of claim 14, wherein the opening define a cavity formed in the substrate and the cavity has a cavity-surface carrying the chip and connecting to the back surface of the chip.

25. The bumpless assembly package of claim 14, wherein the protective layer is made of a material selected from one of insulator, epoxy and bismaleimide-Triazine.

26. The bumpless assembly package of claim 14, wherein the bumpless assembly package further comprises a conductive trace and the first contact electrically connects to the second contact via the conductive trace.

* * * * *